United States Patent [19]

Cohen

[11] 4,004,223
[45] Jan. 18, 1977

[54] AUDIBLE RESISTANCE OR VOLTAGE TESTER

[76] Inventor: Samuel G. Cohen, 1215 Bedford Road, Pleasantville, N.Y. 10570

[22] Filed: June 16, 1975

[21] Appl. No.: 587,154

[52] U.S. Cl. ............................ 324/62; 324/65 P; 324/72.5; 331/111

[51] Int. Cl.² ............................................ G01R 27/00

[58] Field of Search ............ 324/62, 65, 51, 72.5; 331/111, 108 D, 108 C; 317/33 VR

[56] References Cited

UNITED STATES PATENTS

| | | | |
|---|---|---|---|
| 3,284,707 | 11/1966 | Clinton | 324/62 R |
| 3,613,025 | 10/1971 | Joosten, Jr. | 331/108 D |
| 3,684,924 | 8/1972 | Miller, Jr. | 317/33 VR |
| 3,689,832 | 9/1972 | Leto | 324/65 R |
| 3,875,527 | 4/1975 | Garcia | 331/108 D |
| 3,912,879 | 10/1975 | Lawson | 324/51 |

Primary Examiner—John Kominski
Attorney, Agent, or Firm—Richard A. Joel

[57] ABSTRACT

A resistance or voltage tester for producing an audible tone that varies inversely with resistance or voltage. The device comprises an audible wide range resistance and medium range voltage tester in the form of a rectangular small box designed to fit into a shirt pocket. The tester includes a speaker driven by low current logic gates and a transistor. The frequency of the speaker varies inversely proportional to the measured resistances ranging from zero to over 50 megohms and also inversely proportional to the voltage measured. In particular cases, the device can also be used as an audio signal source and with the use of a suitable probe the voltage range can be increased to +400 VDC or 260 VAC.

9 Claims, 2 Drawing Figures

AUDIBLE RESISTANCE OR VOLTAGE TESTER

BACKGROUND OF THE INVENTION

This invention relates to testing devices and particularly to an audible resistance or voltage tester.

The prior art includes U.S. Pat. No. 3,689,832 to Leto et al which basically discloses a resistance tester for producing an audible tone that varies with the resistance up to approximately 25,000 ohms resistance. U.S. Pat. No. 3,284,707 which issued to Henry H. Clinton discloses a circuit continuity or resistance tester having audible output signals while Mason et al, U.S. Pat. No. 3,287,975 is directed to a temperature indicator having an audible signal. The aforementioned prior art patents are not intended to be an all-inclusive list of pertinent patents.

The present invention differs considerably from the prior art in circuit structure and capability. The Audi-Meter device of the present invention comprises a wide range resistance and a medium range voltage tester which may be packaged in a small rectangular box to fit into shirt pockets. The device, through the use of suitable probe, can also be used as an audio signal source. The tester further includes protective circuitry to prevent circuit damage during testing in an active circuit.

SUMMARY OF THE INVENTION

The present invention pertains to an Audi-Meter tester which comprises a resistance or voltage tester that produces an audible tone that varies inversely with resistance or voltage. The invention basically comprises an oscillator, protective diodes, an audio speaker, an amplifier and a transistor utilized as a switch. Specifically, the oscillator produces a unique tone dependent on the resistance of the device being tested and communicates this tone via the audio speaker. The transistor acts as a switch and when in the non-conducting mode limits the current drain on the battery to the transistor leakage current thus lengthening significantly battery life to almost shelf life.

The principal object of the present invention is to provide a new and improved test instrument for measuring either electrical resistance or voltage without requiring the technician to remove his eyes from the equipment being tested. Thus, by producing a tone that decreases in pitch with increased resistance or voltage, the device provides the technician with an audible indication of the approximate magnitude of the parameter being measured. This is also useful when making measurements employing a microscope to prove integrated circuits or as a production aid in a quick comparison of good and bad electronic assemblies.

The invention comprises a small shirt pocket size box containing a battery, electronic circuits, speaker, LED and input connector. The electronic circuits include a predetermined arrangement of protective diodes, input voltage limiter to protect the IC or integrated circuit, a COS MOS ultra low power oscillator, R. C. relaxation oscillator and a speaker driver.

From zero resistance across the probe inputs, the circuit will provide an audible frequency that will decrease as the resistance across the probes increase past 50 megohms without needing to switch range. A light emitting diode (LED) is useful for high noise areas when measuring continuity or very high resistances.

BRIEF DESCRIPTION OF THE DRAWINGS

Other objects and advantages of the present invention may be seen from the following description when viewed in conjunction with the accompanying drawings wherein.

DETAILED DESCRIPTION OF THE INVENTION

Figures 1, 2:
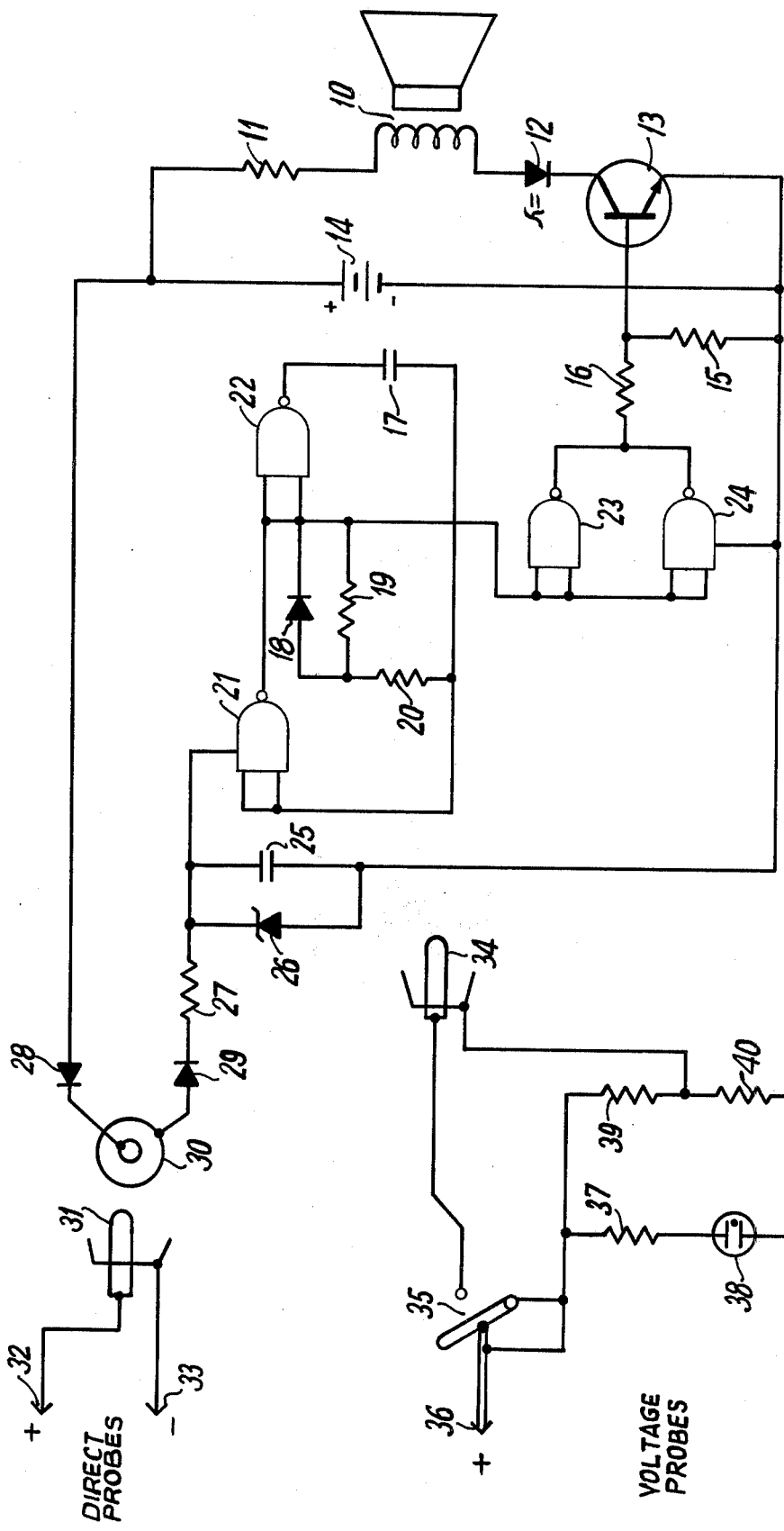
FIG. 1 is a schematic circuit drawing of the Audi-meter testing device comprising the invention, and, FIG. 2 is a schematic drawing of a particular extended voltage probe for use with the subject testing device.

Referring now to the drawings, the Audi-Meter circuit has two modes of oscillation. Mode A is the astable oscillator comprising nand gates 21 and 22, diode 18, resistors 19 and 20 and capacitor 17. Mode B is a relaxation oscillator comprising resistor 27 and capacitor 25 which when allowed to charge to above the operating voltage of the nand gate circuit 21 and 22 will then allow the astable circuit to charge capacitor 17 until its charge through resistors 19 and 20 becomes high enough to cause nand gate 21 to switch and thus provide a pulse to gates 23 and 24 to activate the speaker. This discharges capacitor 25 to below the operating point of the nand gate astable, and this process starts again to produce the next speaker pulses.

During operation as a continuity tester, the battery supplies power through diode 28 to the plus probe 32, through the continuous circuit being tested and back through the minus probe 33 and the outercover of jack 31 to plug 30 to diode 29. This is the input power point to the dual mode oscillator circuit. For this application, resistor 27 and capacitor 25 act as a filter to supply power to the astable circuit, that is, nand gates 21 and 22. Zener diode 26 provides a protection for the nand gates to limit the gate power supply to less than its rated voltage when measuring active or powered up circuits.

The astable circuit operates in the following manner. When power is applied to the nand COS MOS gates 21 through 24, capacitor 17 starts to charge. If the gate 22 output is in its low state and its input is in its high state, then current will go through resistors 19 and 20 to charge capacitor 17. Diode 18 is not used in this half of the astable cycle because it is back biased.

During the initial charging period of capacitor 17, almost all of the IR drop is across resistors 19 and 20, thus holding the input to gate 21 at a low level. Nand gate 21 acting as an inverter, thus momentarily holds the input to nand gate 22 high which holds its output of 22 at a low state. This condition persists until the charge on capacitor 17 increases to a value high enough above the threshold of gate 21 to activate nand gate 21. Then the output of gate 21 goes low causing the output of gate 22 to go high. Capacitor 17 now has a reversed polarity across it and this begins to discharge through resistor 20 and diode 18. The discharge time constant is much less than the charging time constant and could range approximately 10 to 15 times less in ratio. When the capacitor 17 is discharged below the input threshold of gate 21, the gate 21 output again goes high causing the input to gate 22 to become high and causing the output of gate 22 to become low. Thus, the polarity across the R-C network is again reversed and a new cycle is started.

It will be noted that during the longer charging part of the full cycle of capacitor 17, the input of gate 22 is at a high level of voltage thus causing the inputs to parallel gates 23 and 24 to also be high. The outputs of the inverting gates 23 and 24 are low (at battery ground), thus causing transistor 13 to be cut off by applying the low signal through resistor 16 to the transistors base.

When the astable circuit switches to the short part of its cycle and the cathode of diode 18 becomes low the input to gates 23 and 24 is low, and their outputs are high. This positive voltage is applied through the base-emitter current limiting resistor 16 to turn on transistor 13 to its conducting state thus minimizing battery current drain during operation. This causes a short pulse current through the speaker coil. Speaker resonance thus creates an audible signal output. For a high resonance frequency speaker such as a piezoelectric ceramic speaker, transistor 13 would be a Darlington dual transistor thus providing short bursts of high frequency pulses to modulate the speaker output.

Mode B operation extends the useful frequency range of the oscillator or astable free running circuit by turning it on and off to provide an effect similar to a monostable circuit.

When the direct probes 32 and 33 are applied across different resistances, increasing in value from a short or low resistance to high values of resistance, the astable oscillator frequency decreases as its average supply voltage is decreased across capacitor 25. The current drain across capacitor 25 is the series resistances of the following:

A. The parallel resistance of the two P channel FET transistors in gates 23 and 24 in series with:

B. Resistor 16 in series with:

C. The base emitter diode drop of transistor 13.

As the resistance being tested across the probes 32 and 33 is increased the voltage divider action across the external and internal three series resistances causes the supply voltage to the astable to be proportionately reduced. This causes the astable circuit to lower its frequency until the point where the supply voltage for gates 21 and 22 is no longer high enough to sustain oscillation of the astable. When the astable operation stops, its demand for current is stopped by opening the P channels of gates 23 and 24. This allows capacitor 25 to charge to the battery voltage, less diode drops of 28 and 29. As capacitor 25 charges to a higher voltage, the astable circuit 21 and 22 starts to charge capacitor 17 as previously described except now the time constant of charge is made up of three instead of two resistances, that is, resistors 19, 20 and the external resistance across probes 32 and 33. Again, when the charge across capacitor 17 reaches the threshold of gate 21 input, both gates 21 and 22 switch polarities causing capacitor 25 to discharge its energy into the transistor 13 base through resistor 16. This turns on transistor 13 providing a pulse to the speaker coil. When the energy of capacitor 25 has been dissipated to the extent that its voltage goes below the operating point of gates 23 and 24 the pulse stops, transistor 13 turns off and capacitor 25 is again allowed to recharge from the battery. For high resistances being tested above 1 megohm, the speaker buzzes at a low frequency.

For use in sensing higher voltages (conversion of voltage to an inversely proportional audible tone frequency). The probe of FIG. 2 can be used. The probe may comprise a tube housing, a spring loaded probe tip sensor 36, which when pressed against the point being measured for voltage, closes switch 35 to provide continuity to the center element of polarized jack connector 34 as well as connect the voltage being sensed to one side of the divider network resitors 37 and 39. The alligator clip on probe 43 is connected to the low side ground of a circuit being sensed.

The voltage across probes 36 and 43 is divided across resistors 39, 40 and 41. If a low voltage (below 110 VDC) is being sensed, neon indicator 38 is not activated and is an open circuit. Thus, the voltage applied to jack 34 is developed across resistor 39 by dividing the input by the ratio of resistor 39 to the sum of resistors 39, 40 and 41. The diode 42 prevents a negative input to the Audi-Meter as this will cause a high battery current drain. The dide 42 also allows AC voltage to be sensed and converted to a modulated tone signal only allowing the tone on the positive half cycles of the input voltage.

At higher voltages, (above 110 AC) the neon will glow. One element glows with DC input and both elements will glow when AC is sensed by the probe. The neon thus puts a breakpoint in the voltage vs. frequency out curve to make the curve approach a more linear voltage vs. frequency effect up to 400 VDC or 260 VAC.

Active circuit currents can be monitored by using the direct probes across a selected fixed resistor in series with the current being sensed.

| Current Range of Audi-Meter | Resistor to be Used | Wattage of Resistor |
| --- | --- | --- |
| 0 to 5 ma | 1000 ohms | ¼W |
| 0 to 50 ma | 100 ohms | ¼W |
| 0 to ½ amp | 10 ohms | 3W |
| 0 to 5 amp | 1 ohm | 25W |

The direct probes can be used to inject an AC signal audio into an active powered on circuit by putting a resistance selected to obtain desired peak to peak signal from Audi-Meter across the direct probes and coupling the resultant signal into the circuit under test by a capacitor.

Thus, the Audi-Meter can act similar to a signal generator providing a selectes audio frequency between 1 HZ (pulses) and approximately 600 HZ to a circuit under test.

As further advantages, the test device can cover an extremely wide range of ohmic and voltage to audible frequency conversion without the use of an external switching permitting the operator to make measurements with his hands free and also no power switch is needed since the unit does not draw power from the battery unless a measurement is being taken. It is also to be noted that a variation in current in active circuits can be heard and the test lead outputs can be used to inject low frequency audio signals into a circuit under test to determine if it is functional when it is powered. While described as a test device, the Audi-Meter can also be used as a comparison device to compare two or more electrical circuits, passive or active.

While the invention has been explained by a detailed description of certain specific embodiments, it is understood that various modifications and substitutions can be made in any of them within the scope of the appended claims which are intended also to include equivalents of such embodiments.

What is claimed is:

1. An audible testing device for testing the current, voltage or resistance of a circuit over a wide range comprising:
   a power supply,
   first and second input leads for connection to the circuit being tested, said first lead being coupled to the power supply,
   a relaxation oscillator connected to the second input lead for filtering power therethrough,
   an astable oscillator coupled to the output of the relaxation oscillator and activated thereby,
   a pair of parallel gates coupled to the output of the astable oscillator to receive pulses therefrom,
   switching means periodically activated by the output of the gates, and,
   a speaker in series with said switching means and connected across the power supply to be activated by the switch pulses to produce an audible tone inversely proportional to the resistance or voltage or current being tested.

2. An audible testing device in accordance with claim 1 wherein:
   the astable oscillator includes a pair of interconnected nand gates and a capacitive element intermittedly charged and discharged by the outputs of said gates in synchronization with the relaxation oscillator.

3. An audible testing device in accordance with claim 1 further including:
   a female input plug having the first and second input leads connected thereto and a male connecting element for coupling to said plug and said element having a pair of probes connected thereto for contacting the circuit under test.

4. An audible testing device in accordance with claim 1 further including:
   an input plug having the first and second input leads connected thereto, and,
   a connecting element for said plug having a pair of probes comprising a spring-loaded switch connected to a first probe which is closed by contacting the circuit under test, a divider network connected to the switch and the other probe having at least two resistors in parallel and a neon indicator in one parallel branch to limit the voltage and linearize the voltage to audio output frequency.

5. An audible testing device in accordance with claim 1 wherein:
   the switching means comprises a Darlington dual transistor to provide short bursts of high frequency pulses to modulate the speaker output.

6. An audible testing device for testing the resistance or voltage or current of a circuit over a wide range in accordance with claim 1 further including:
   means connected in each input lead for protecting the testing device when connected said device to active circuits for testing, said means further changing the magnitude of the speaker volume.

7. An audible testing device in accordance with claim 6 wherein:
   the protecting means comprises a diode connected in each input lead and wherein the audible tone is inversely proportional to the circuit under test, and further including a zener diode coupled across the astable oscillator to limit the maximum power supply to the said oscillator.

8. An audible testing device in accordance with claim 6 wherein:
   the pair of parallel gates comprise nand gates employing complimentary MOS elements.

9. An audible testing device in accordance with claim 6 wherein:
   the switching means comprises a transistor having the speaker connected across its collector emitter circuit and having its base coupled to the output of the parallel gates to obtain audio tones without the use of an audio amplifier.

* * * * *